United States Patent
Ranjan et al.

(10) Patent No.: US 9,779,952 B2
(45) Date of Patent: Oct. 3, 2017

(54) METHOD FOR LATERALLY TRIMMING A HARDMASK

(71) Applicant: Tokyo Electron Limited, Minato-ku, Tokyo (JP)

(72) Inventors: Alok Ranjan, Mechanicville, NY (US); Sergey Voronin, Rensselaer, NY (US)

(73) Assignee: Tokyo Electron Limited, Tokyo (JP)

( * ) Notice: Subject to any disclaimer, the term of this patent is extended or adjusted under 35 U.S.C. 154(b) by 61 days.

(21) Appl. No.: 14/465,519

(22) Filed: Aug. 21, 2014

(65) Prior Publication Data

US 2015/0064918 A1    Mar. 5, 2015

Related U.S. Application Data

(60) Provisional application No. 61/870,546, filed on Aug. 27, 2013.

(51) Int. Cl.
   *H01L 21/302*   (2006.01)
   *H01L 21/461*   (2006.01)
   (Continued)

(52) U.S. Cl.
   CPC ........ *H01L 21/3065* (2013.01); *H01L 21/308* (2013.01); *H01L 21/3086* (2013.01); *H01L 21/30604* (2013.01); *H01L 21/31116* (2013.01)

(58) Field of Classification Search
   None
   See application file for complete search history.

(56) References Cited

U.S. PATENT DOCUMENTS

| 6,423,457 B1 * | 7/2002 | Bell | G03F 7/40 257/E21.256 |
| 6,893,975 B1 * | 5/2005 | Yue | H01L 22/20 257/E21.257 |

(Continued)

FOREIGN PATENT DOCUMENTS

| JP | 2001237415 A | 8/2001 |
| JP | 2007081383 A | 3/2007 |

(Continued)

OTHER PUBLICATIONS

PCT International Patent Application Serial No. PCT/US2014/052124, "International Search Report and Written Opinion," dated Oct. 30, 2014, International Filing Date Aug. 21, 2014.

(Continued)

*Primary Examiner* — Stephanie Duclair
(74) *Attorney, Agent, or Firm* — Wood Herron & Evans LLP

(57) ABSTRACT

Techniques herein include methods for controllable lateral etching of dielectrics in polymerizing fluorocarbon plasmas. Methods can include dielectric stack etching that uses a mask trimming step as part of a silicon etching process. Using a fluorocarbon mixture for dielectric mask trimming provides several advantages, such as being straightforward to apply and providing additional flexibility to the process flow. Thus, techniques herein provide a method to correct or tune CDs on a hardmask. In general, this technique can include using a fluorine-based and a fluorocarbon-based, or fluorohydrocarbon-based, chemistry for creating a plasma, and controlling a ratio of the two chemistries. Without the hardmask trim method disclosed herein, if a hardmask CD is not on target, then a wafer is scrapped. With hard-mask trim capability in silicon etch as disclosed herein, a given CD can be re-targeted to eliminate wafer-scraps.

20 Claims, 2 Drawing Sheets

(51) Int. Cl.
  *B44C 1/22* (2006.01)
  *C03C 15/00* (2006.01)
  *C03C 25/68* (2006.01)
  *C23F 1/00* (2006.01)
  *H01L 21/3065* (2006.01)
  *H01L 21/306* (2006.01)
  *H01L 21/308* (2006.01)
  *H01L 21/311* (2006.01)

(56) References Cited

U.S. PATENT DOCUMENTS

| | | | |
|---|---|---|---|
| 7,910,483 | B2 | 3/2011 | Abatchev et al. |
| 2003/0045101 | A1 | 3/2003 | Flanner et al. |
| 2003/0162407 | A1 | 8/2003 | Maex et al. |
| 2005/0191832 | A1* | 9/2005 | Huang ............... H01L 21/0337 438/585 |
| 2005/0221619 | A1 | 10/2005 | Yue et al. |
| 2006/0046496 | A1* | 3/2006 | Mui et al. .................... 438/710 |
| 2007/0249177 | A1 | 10/2007 | Koemtzopoulos et al. |
| 2009/0121324 | A1 | 5/2009 | Sadjadi et al. |
| 2013/0164659 | A1 | 6/2013 | Keller et al. |

FOREIGN PATENT DOCUMENTS

| | | |
|---|---|---|
| JP | 2009152588 A | 7/2009 |
| JP | 2009529784 A | 8/2009 |
| KR | 20070005921 A | 1/2007 |
| KR | 20070116076 A | 12/2007 |
| WO | 2011018663 A1 | 9/2011 |

OTHER PUBLICATIONS

Taiwan Intellectual Property Office, Notification of Examination Opinion issued in corresponding TW Application No. 103129412 dated Sep. 11, 2015, 16 pp., including English translation.

The International Bureau of WIPO, International Perliminary Report on Patentability issued on corresponding Application No. PCT/US2014/052124 dated Mar. 1, 2016, 7 pp.

Korean Intellectual Property Office, Office Action issued in counterpart KR Application No. 10-2016-7007044 dated Feb. 10, 2017, 15 pp., including English translation.

Japan Patent Office, Office Action issued in counterpart JP Application No. 2016-538982 dated Jan. 17, 2017, 13 pp., including English translation.

* cited by examiner

METHOD FOR LATERALLY TRIMMING A HARDMASK

CROSS REFERENCE TO RELATED APPLICATIONS

The present application claims the benefit of U.S. Provisional Patent Application No. 61/870,546, filed on Aug. 27, 2013, entitled "Method for Laterally Trimming a Hardmask," which is incorporated herein by reference in its entirety.

BACKGROUND OF THE INVENTION

This invention relates to plasma processing and, in particular, to etching of substrates using plasma products.

SUMMARY

Semiconductor fabrication involves creating a pattern of features in a substrate. This pattern is typically created using photolithography techniques. Photolithography techniques involve creating a latent pattern in photoresist, developing the latent pattern into a relief pattern, and then transferring the relief pattern into one or more underlying layers such as to create a hardmask, dielectric mask, or various structures that may be permanent or sacrificial. Transferring the relief pattern into underlying layers can be accomplished by etching techniques. If a given resulting hardmask has lines or features with a critical dimension (CD) that is too large, then corresponding substrates (wafers) are unusable and typically scrapped. Such a wafer loss resulting from hardmask CDs that are too large can be a significant loss.

Techniques herein provide a method to correct or tune CDs on a hardmask that do not meet a specified value. Techniques herein provide a method to shrink hardmask dimensions to prevent wafers from becoming unusable. Specifically, techniques herein provide a method of laterally etching a dielectric hardmask to fall within a specified CD to be viable for continued fabrication. Techniques include changing the chemistry in the breakthrough or main etch to tune the CD. This can trim a substantial portion of the dielectric hardmask, such as up to 6 nm or more. For example, this technique can reduce a critical dimension or dimension of a structure from about 36 nm to about 30 nm.

Changing carbon to fluorine (C/F) atomic ratio in processing plasmas enables protective polymer thickness control on dielectric mask sidewalls. Controlling this ratio makes possible precise lateral etching of the structure, i.e. "trimming" of the incoming mask. The C/F ratio in the plasma can be controlled by adjusting flow rates of two or several precursors with different C:F ratios in a molecular structure.

One benefit of methods herein is that the outgoing critical dimension (CD) can be controlled independently with no need for adjustment in lithography and Hard Mask Opening (HMO) processes. Features herein can significantly simplify the process optimization and reduce process development time.

Methods herein include a new etching scheme for "dielectric-Si" stack etching that includes a mask trimming step as part of the Si etching process. Thus, techniques herein can provide an all-in-one solution. Using a fluorocarbon mixture for dielectric mask trimming provides several advantages, such as it is straightforward to apply and gives additional flexibility to the process flow. Without the hardmask trim method disclosed herein, if a hardmask CD is not on target, then a wafer is scrapped. With hard-mask trim capability in silicon etch as disclosed herein, then a given CD can be re-targeted to eliminate wafer-scraps. For example, if a hardmask open process tool can only make a good profile for a particular CD identified as being wide (too wide), then this wide CD can be narrowed by executing techniques herein.

One example embodiment includes a method for etching features on a substrate. Such a method can include disposing a substrate on a substrate holder in a plasma processing system. The substrate has a patterned hardmask defining openings that expose an underlying substrate. The patterned hardmask has features with a critical dimension (CD) greater than a predetermined specified critical dimension of target features. An etching process gas is flowed into the plasma processing system. The etching process gas comprises a fluorine-containing gas. A passivating process gas is flowed into the plasma processing system. The passivating process gas comprises a fluorocarbon. A plasma is formed from the etching process gas and the passivating process gas such that the substrate is exposed to the plasma. Sidewalls of the hardmask are laterally etched using products of the plasma by controlling a ratio of etching process gas to passivating process gas, and by controlling electrode bias in the plasma processing system.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Figures 1A, 1B:
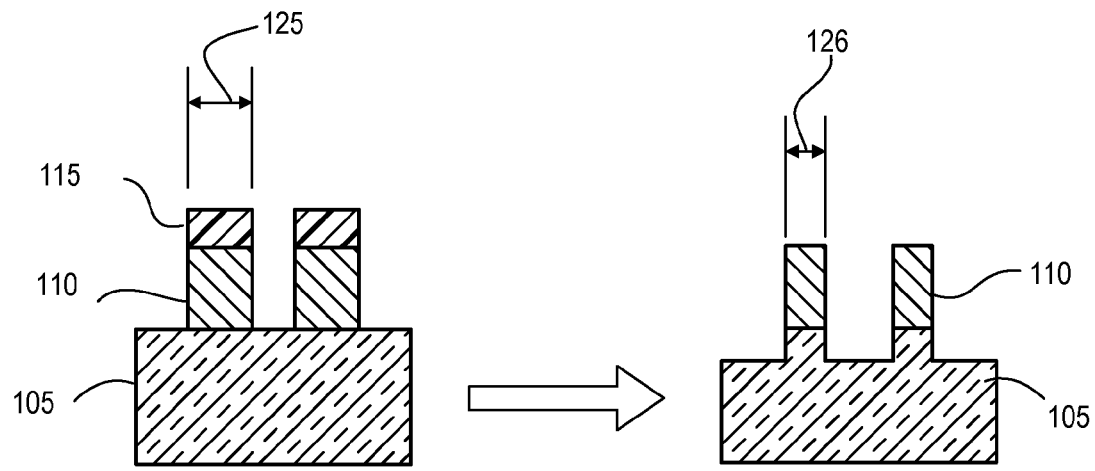
FIG. 1A is a cross-sectional schematic view of an example substrate being processed according to embodiments herein.
FIG. 1B is a cross-sectional schematic view of an example substrate being processed according to embodiments herein.

Techniques herein include methods of controllable lateral etching of dielectrics in polymerizing fluorocarbon plasmas. Methods herein include an etching scheme for "dielectric-Si" stack etching that includes a mask trimming step as part of the Si etching process. Thus, techniques herein can provide an all-in-one solution. Using a fluorocarbon mixture for dielectric mask trimming provides several advantages, such as it is straightforward to apply and gives additional flexibility to the process flow. Without the hardmask trim method disclosed herein, if a hardmask CD is not on target, then a wafer is scrapped. With hard-mask trim capability in silicon etch as disclosed herein, a given CD can be re-targeted to eliminate wafer-scraps. For example, if a hardmask open process tool can only make a good profile for a particular CD identified as being wide (too wide), then this wide CD can be narrowed by executing techniques herein.

Techniques herein provide a method to correct or tune CDs on a hardmask. Techniques herein provide a method to shrink hardmask dimensions to prevent wafers from becoming unusable. Specifically, techniques herein provide a method of laterally etching a dielectric hardmask to fall within a specified CD to be viable for continued fabrication. In general, this technique can include using a fluorine-based and a fluorocarbon-based, or fluorohydrocarbon-based, chemistry for creating plasma, and controlling a ratio of the two chemistries.

One embodiment includes a method for etching features on a substrate. This method includes disposing a substrate on a substrate holder in a plasma processing system. For example, a semiconductor wafer is loaded onto an electrostatic chuck in a plasma processing chamber. The substrate has a patterned hardmask defining openings that expose an underlying substrate. The patterned hardmask has features with a critical dimension (CD) greater than a predetermined specified critical dimension of target features. Note that the patterned hardmask can be a single layer or single material, or can include multiple layers and/or multiple materials. In embodiments with multiple layers comprising the hardmask, such layers can include a layer of silicon oxide and a layer of silicon nitride. In some embodiments, the underlying substrate can be a silicon substrate. In some embodiments, the substrate can have a patterned silicon-containing layer on top of the patterned hardmask. The patterned hardmask can be selected from a dielectric material and can include silicon nitride and/or silicon oxide.

The patterned hardmask having features with a critical dimension (CD) greater than a predetermined specified critical dimension of target features can be identified from one or more measurement steps to verify critical dimensions. For example, a scanning electron microscope system can identify that the critical dimension of the patterned hard mask features is greater than the predetermined specified critical dimension of target features, which can be a trigger to dispose the substrate on the substrate holder.

Figures 2A, 2B:
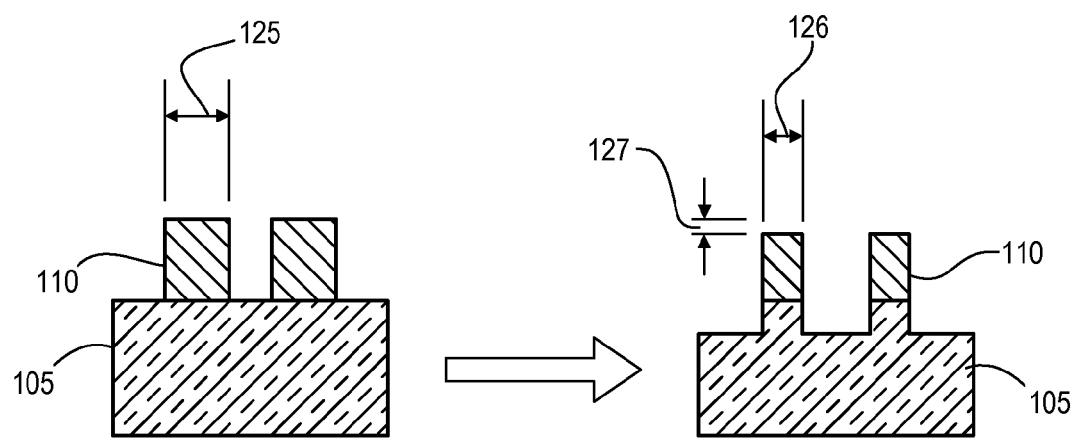
FIG. 2A is a cross-sectional schematic view of an example substrate being processed according to embodiments herein.
FIG. 2B is a cross-sectional schematic view of an example substrate being processed according to embodiments herein.

FIG. 1A and FIG. 2A are cross-sectional schematic diagrams of an example substrate segment needing adjustment. FIG. 1A shows a hardmask scheme having a protective layer 115, which can be a layer of silicon, on top of a dielectric hardmask 110. The dielectric hardmask 110 can be, for example, a nitride or oxide material. This dielectric hardmask 110 can include multiple layers of different or identical dielectric materials. The dielectric hardmask 110 can be embodied as a single dielectric material layer. In other alternative embodiments, the dielectric hardmask 110 can include an organic planarization layer (OPL) along with the oxide and/or nitride layer. Alternatively, the hardmask can be half silicon nitride and half silicon oxide. Dielectric hardmask 110 can be positioned on underlying substrate 105, which can include a silicon substrate. FIG. 2A is similar to FIG. 1A, but does not include a protective layer 115. A pattern defined by the hardmask 110 can be formed using conventional photolithography patterning techniques of creating a photoresist relief pattern followed by etching techniques to transfer the relief pattern into the dielectric hardmask 110. The dielectric hardmask 110 of FIGS. 1A and 2A has an initial CD 125 that is greater than specified dimensions to be transferred into underlying substrate 105.

With a substrate disposed in the plasma processing system, an etching process gas is flowed into the plasma processing system. This etching process gas comprises a fluorine-containing gas. By way of a non-limiting example, flowing the etching process gas can include flowing $SF_6$ (sulfur hexafluoride), $NF_3$ (nitrogen trifluoride), $CF_4$ (tetrafluoromethane), or $XeF_2$ (xenon difluoride), etc., or combinations thereof.

A passivating process gas is also flowed into the plasma processing system. The passivating process gas comprises a fluorocarbon. By way of a non-limiting example, the passivating process gas can include a diatomic molecular gas selected from the group consisting of $N_2$ and $H_2$. Alternatively, the passivating process gas can include $CH_2F_2$ (difluoromethane), $CF_4$, $CHF_3$, $CH_3F$, $C_2F_4$, $C_4F_8$, $C_4F_6$, $C_5HF_7$, $C_5F_8$, or combinations thereof. Methods can also include flowing a diluent process gas into the plasma processing system. Example diluent process gases include $N_2$, Argon, and Helium.

Embodiments include forming plasma from the etching process gas and the passivating process gas such that the substrate is exposed to the plasma. Depending on a particular type of plasma processing chamber selected for use, plasma can be formed immediately over a given substrate, or many centimeters above the given substrate.

Methods include laterally etching sidewalls of the hardmask using products of the plasma by controlling a ratio of etching process gas to passivating process gas, and by controlling electrode bias in the plasma processing system. Controlling the ratio of etching process gas to passivating process gas can include maintaining the ratio between about 0.10 and 10.0. Controlling the ratio of etching process gas to passivating process gas can alternatively include maintaining the ratio between about 2.5 and 5.0. Controlling electrode bias, for example, can include controlling electrode bias such that there is isotropic movement of products from the plasma, that is, an isotropic flow component toward the substrate. Controlling electrode bias can include causing a first portion of products from the plasma to anisotropically strike the substrate, and a remaining portion of products from the plasma to isotropically strike the substrate. In other embodiments, controlling electrode bias can include maintaining a fully isotropic plasma product exposure to the substrate. Laterally etching sidewalls can include laterally etching a predetermined amount of dielectric material such that the critical dimension of the features on the patterned hardmask is reduced to within the predetermined specified critical dimensions of the features. In some embodiments, laterally etching sidewalls can include reducing feature thickness by about 0.3 to 30 nanometers. In other embodiments, laterally etching sidewalls can include reducing feature thickness by about 5 to 15 nanometers.

FIGS. 1B and 2B show example results after completing reactive ion etching in polymerizing plasma (such as CH2F2 and SF6), as well as changing a ratio of gases to control lateral etch rate of the dielectric hardmask. Note that a resulting CD 126 has a smaller dimension than initial CD 125. Also note that some vertical trimming 127 can happen, but by selecting a sufficient thickness of dielectric hardmask 110, any vertical etching will not impact subsequent processing such as pattern transfer into underlying substrate 105. In some embodiments, the protective layer 115 can be removed as part of the lateral etching process, or can be separately removed after completing a lateral etching step. Example results in FIGS. 1B and 2B thus illustrate a dielectric mask having been laterally adjusted and thereby enabling the substrate to continue with fabrication.

Figure 3:
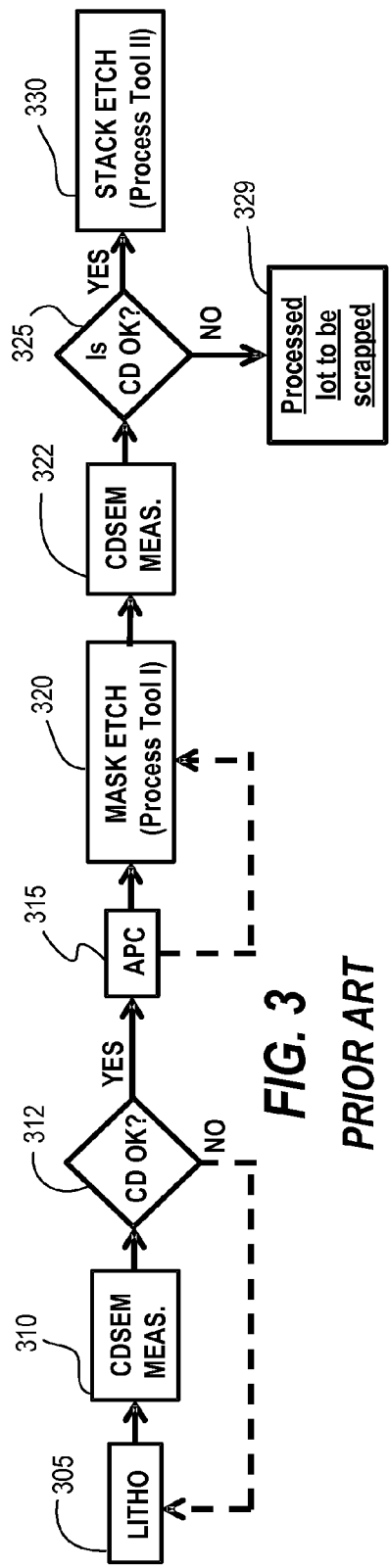
FIG. 3 is an example conventional flow for processing a semiconductor substrate.
Figure 4:
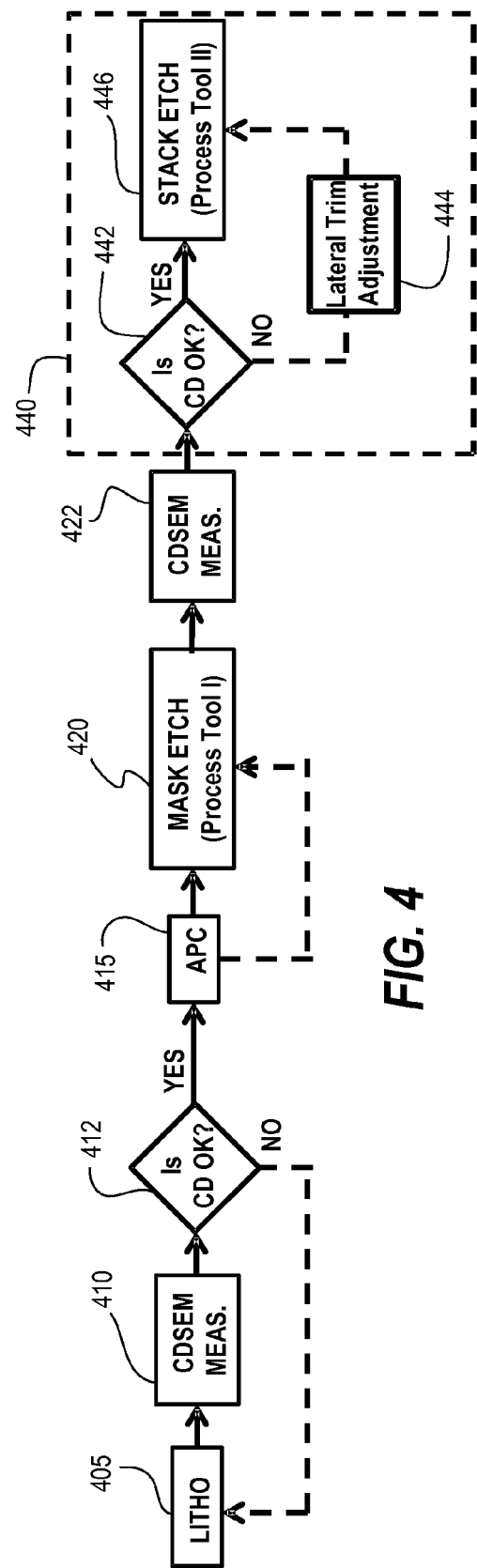
FIG. 4 is an example flow for processing a semiconductor substrate according to embodiments herein.

FIGS. 3 and 4 are flow charts of a particular fabrication sequence. FIG. 3 illustrates a conventional process flow for measurement and quality control to optimize critical dimensions. CD optimization can specify changes in lithography and dielectric mask etching processes. When a mistake occurs, process optimization starts from the beginning, which complicates fabrication because optimization involves many process tools in line and can require relatively long periods of time. Flow begins with a lithography step 305 for patterning a substrate. This can include film coating, exposure, and developing. Lithography is followed by CD measurement 310, which can be executed using a scanning electron microscope (SEM) or other measurement technique. An evaluation (312) of a SEM image can be used to determine whether a CD of a patterned photoresist layer is acceptable. If the patterned photoresist is not acceptable, then lithography steps can be reworked. If CDs from a patterned photoresist (relief pattern) are acceptable, then the process flow can continue to subsequent steps such as hardmask opening steps. In conjunction with advance process controls (APC) (315), a pattern defined by a photoresist is transferred to a hardmask via a mask etch process 320. After completing the mask etch process 320, the photoresist is removed and SEM images of hardmask CDs can be evaluated (322). A second CD evaluation 325 is completed. If the CDs of the hardmask are acceptable, then processing can continue to stack etching (330), such as on a different etching tool. If, however, an evaluation of SEM images identifies an unacceptable hardmask CD, then a corresponding lot of wafers needs to be scrapped (329), which can be a severe loss especially because of time lost in re-tuning the flow and beginning fabrication on a replacement set of wafers. For example, if a target hardmask CD is a 13 nm line, but a resulting line from the hardmask open step is 25 nm or 36 nm or so on, then the wafer is essentially useless for transferring an acceptable pattern.

FIG. 4 is a hard mask etching process flow according to embodiments herein. The process flow of FIG. 4 illustrates CD optimization including CD adjustments when needed. Accordingly, CDs can be optimized in final process steps 440 by adjusting deposition/etch process chemistry, which in turn saves resources and process development time. Flow begins with a lithography step 405 for patterning a substrate. This can include film coating, exposure, and developing. Lithography is followed by CD measurement 410, which can be executed using a scanning electron microscope (SEM) or other measurement technique. An evaluation (412) of a SEM image can be used to determine whether a CD of a patterned photoresist layer is acceptable. If the patterned photoresist is not acceptable, then lithography steps can be reworked. If CDs from a patterned photoresist (relief pattern) are acceptable, then the process flow can continue to subsequent steps such as hardmask opening steps. In conjunction with advance process controls (APC) (415), a pattern defined by a photoresist is transferred to a hardmask via a mask etch process 420. After completing the mask etch process 420, the photoresist is removed and SEM images of hardmask CDs can be evaluated (422). A second CD evaluation 442 is completed. If the CDs of the hardmask are acceptable, then processing can continue to stack etching (446), such as on a different etching tool. If CDs are not acceptable, however, then a lateral trimming step can be executed to trim a given CD that is wider than a targeted CD using lateral trim process 444 as described above. Thus, if a hardmask CD is too wide, then a lateral etching step is executed that uses an optimal ratio of etching and passivating gases (such as SF6 and CH2F2) to adjust an unacceptable dielectric hardmask CD.

Beneficial lateral etch results have be achieved in controlling the ratio of the etching gases by increasing or decreasing either gas. By way of a non-limiting example, an amount of passivating process gas flowed into a processing chamber can be varied. Example process conditions can include 15 mT pressure and 2000 W/150 W of power, with the process gas mixture being flowed for about 10-20 seconds. An example process gas mixture can include 30 sccm SF6, 100 sccm N2, 500 sccm Argon, and different amounts of CH2F2 can yield different results. If a given incoming mask CD is approximately 25 nm, then when 27 sccm CH2F2 is flowed, a resulting CD can be around 12 nm. Alternatively, when 32 sccm CH2F2 is flowed, a resulting CD can be around 18 nm. As another example, when 45 sccm CH2F2 is flowed, a resulting CD can be around 20 nm. Lateral etching results can benefit from reducing sidewall C/F protection, such that a given mask can be substantially slimmed.

Similar results have been achieved by adjusting the etching process gas or etching process gas mixture. For example a process gas mixture can include 45 sccm CH2F2, 100 sccm N2, 500 sccm Argon and variable amounts of SF6, with the process gas mixture being flowed for about 15-30 seconds. With an initial mask CD of 36 nm is etched using a 38 sccm from of SF6, then a mask CD is reduced to 29 nm. When 41 sccm of SF6 is flowed, then the mask CD is reduced to 27 nm. When 43 sccm of SF6 is flowed, then the mask CD is reduced to 26 nm. Thus, hardmask slimming can be increased by increasing a flow rate of SF6, that is, the etching process gas.

Returning now to FIG. 1A, the dielectric mask layer 110 can optionally include an additional silicon layer on top. Using SF6 chemistry can enable better etching as a "lean" chemistry, while at the same time enabling trimming in the lateral (horizontal) direction. Both vertical and lateral etch can be controlled effectively using this chemistry. Etching can be partially isotropic or fully isotropic. The lower silicon layer (substrate 105) can be partially etched during this step. With such slimming herein, a line or feature of a specified CD is produced, which is then ready for continued fabrication processing such as a reversal step or stack etching steps.

Using a relatively high flow of CH2F2 (45 sccm), a resulting CD can be relatively large (20.3 nm). When lowering the flow to 32 sccm of CH2F2, a resulting CD is 17.5 nm. Continuing, a 27 sccm flow of CH2F2 can result in a mask CD of 12.3 nm. Note that these example result all use 30 sccm or SF6. By reducing CH2F2, substrate or mask features can be trimmed even more. Thus, by changing the CH2F2 amounts, CD slimming of dielectric hardmask can be produced and tuned. In other examples, a ratio of SF6 to CH2F2 can vary between about 0.2 and 10.0. Optionally, a flow of SF6 can be changed instead of a flow of CH2F2. If many applications, increasing SF6 flow generally results in a smaller CD. Thus, by either decreasing CH2F2 and/or increasing SF6, both techniques can result in trimming a CD in a desired direction or a desired amount. FIG. 1B shows a resulting trimmed or tuned dielectric mask. Note that resulting CD 126 is smaller than initial CD 125. Also note that the dielectric mask 110 of FIG. 1B retained an initial height because of the protective layer 115 during lateral etch. Other etchant and passivant gases can be substituted as previously described.

In situations in which there is no protective silicon, there can be vertical etching of the dielectric hardmask in addition to the lateral etching. FIG. 2B illustrates an example of a dielectric mask scheme without an upper silicon layer for protection. Note that there is some pull-down (vertical trimming) of this hardmask, but some vertical trimming can be acceptable depending on resulting hardmask height.

In the lateral etching regime, the passivant (such as CH2F2) can be used to control or prevent the etchant (SF6 or NF3) from quickly etching away the entire hardmask layer. Note that all varieties of flurohydrocarbon can be used including CF4, CHF3, CH3F, C2F4, C4F8, C4F6, C5HF7, and C5F8. Carrier and/or diluent gases can be used such as N2, Argon, and Helium. Such lateral trimming can be executed after a main etch step or mask etch step, though optionally the lateral etch step can be executed with the main etch step or immediately afterwards.

Such lateral etching can be executed in any number of existing plasma processing chambers. For example, ICP (inductively coupled systems), CCP (capacitively coupled system), microwave systems, surface wave plasma systems, and so forth, are well known and can be used to execute the lateral etching techniques herein. Such plasma processing systems typically include a processing chamber with a substrate holder. A power coupling system can be used to energize a process gas to form plasma. Process gas inlets can feed one or more process gas chemistries into the processing chamber from various entrance locations. A vacuum pump can exhaust gases from the processing chamber. An electrical system can control ion energy by coupling bias power for anisotropic etching or removing bias power for isotropic etching.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to the object being processed in accordance with the invention. The substrate may include any material portion or structure of a device, particularly a semiconductor or other electronics device, and may, for example, be a base substrate structure, such as a semiconductor wafer, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for etching features on a substrate, the method comprising:
   disposing a substrate on a substrate holder in a plasma processing system, the substrate having a patterned hardmask with features defining openings that expose an underlying substrate, the patterned hardmask features having a critical dimension (CD) greater than a predetermined specified critical dimension of target features;
   flowing an etching process gas into the plasma processing system, the etching process gas comprising a fluorine-containing gas;
   flowing a passivating process gas into the plasma processing system, the passivating process gas comprising a fluorocarbon;
   forming plasma from the etching process gas and the passivating process gas such that the substrate is exposed to the plasma; and
   laterally etching sidewalls of the patterned hardmask features using products of the plasma by controlling a ratio of etching process gas to passivating process gas, and by controlling electrode bias in the plasma processing system.

2. The method of claim 1, wherein the underlying substrate is a silicon substrate, and wherein the passivating process gas includes a diatomic molecular gas selected from the group consisting of N2 and H2.

3. The method of claim 1, wherein controlling the ratio of etching process gas to passivating process gas comprises maintaining the ratio between 0.10 and 10.0.

4. The method of claim 3, wherein controlling the ratio of etching process gas to passivating process gas comprises maintaining the ratio between 2.5 and 5.0.

5. The method of claim 1, wherein controlling electrode bias includes controlling electrode bias such that there is isotropic movement of products from the plasma.

6. The method of claim 1, wherein controlling electrode bias includes causing a first portion of products from the plasma to anisotropically strike the substrate, and a remaining portion of products from the plasma to isotropically strike the substrate.

7. The method of claim 1, wherein controlling electrode bias includes maintaining a fully isotropic plasma product exposure to the substrate.

8. The method of claim 1, wherein disposing the substrate on the substrate holder includes the substrate having a patterned silicon-containing layer on top of the patterned hardmask.

9. The method of claim 1, wherein disposing the substrate on the substrate holder includes the patterned hardmask including two or more layers, wherein the two or more layers include silicon oxide and silicon nitride.

10. The method of claim 1, wherein disposing the substrate on the substrate holder includes the patterned hardmask being a dielectric material selected from the group consisting of silicon nitride and silicon oxide.

11. The method of claim 1, wherein flowing the etching process gas includes flowing a gas selected from the group consisting of SF6, NF3, CF4, and XeF2.

12. The method of claim 1, wherein flowing the passivating process gas includes flowing a gas selected from the group consisting of CH2F2, CF4, CHF3, CH3F, C2F4, C4F8, C4F6, C5HF7, and C5F8.

13. The method of claim 1, further comprising, flowing a diluent process gas into the plasma processing system, the diluent process gas including N2, argon, and helium.

14. The method of claim 1, wherein laterally etching sidewalls includes laterally etching a predetermined amount such that the critical dimension of the features on the patterned hardmask is reduced to within the predetermined specified critical dimensions of the features.

15. The method of claim 1, wherein laterally etching sidewalls includes reducing feature thickness by about 0.3 to 30 nanometers.

16. The method of claim 15, wherein laterally etching sidewalls includes reducing feature thickness by about 5 to 15 nanometers.

17. The method of claim 1, wherein disposing the substrate on the substrate holder is in response to identifying, via scanning electron microscope, that the critical dimension of the patterned hard mask features is greater than the predetermined specified critical dimension of target features.

18. The method of claim 1, further comprising:
transferring the features from the patterned hardmask into the underlying substrate with the predetermined specified critical dimension to produce the target features in the substrate.

19. A method for dielectric hardmask trimming in a silicon etch process, the method comprising:
disposing a substrate on a substrate holder in a plasma processing system, the substrate having a dielectric hardmask patterned with features that define openings that expose an underlying silicon substrate, the features having a critical dimension (CD) greater than a predetermined specified critical dimension of target features, and the dielectric hardmask comprising silicon nitride, silicon oxide, or both;
flowing a fluorine-containing etching process gas selected from the group consisting of SF6, NF3, CF4, and XeF2 into the plasma processing system;
flowing a passivating process gas into the plasma processing system, the passivating process gas selected from the group consisting of CH2F2, CHF3, CH3F, C2F4, C4F8, C4F6, C5HF7, and C5F8;
forming a polymerizing plasma from the etching process gas and the passivating process gas and controlling the C:F ratio in the polymerizing plasma by controlling the flow rates of the etching process gas and passivating process gas;
controlling electrode bias in the plasma processing system;
removing a predetermined amount of dielectric hardmask material from the sidewalls by reactive ion etching the sidewalls of the features laterally such that the critical dimension of the features of the dielectric hardmask is reduced to within the predetermined specified critical dimensions of the features, wherein reactive ion etching is executed by exposing the substrate to the polymerizing plasma while controlling the C:F ratio and electrode bias; and
transferring the features from the dielectric hardmask into the underlying silicon substrate with the predetermined specified critical dimension such that the target features are produced in the silicon substrate.

20. The method of claim 19, wherein the passivating process gas includes a diatomic molecular gas selected from the group consisting of N2 and H2.

* * * * *